US011757004B2

(12) United States Patent
Glass et al.

(10) Patent No.: US 11,757,004 B2
(45) Date of Patent: Sep. 12, 2023

(54) TRANSISTORS INCLUDING SOURCE/DRAIN EMPLOYING DOUBLE-CHARGE DOPANTS

(71) Applicant: INTEL CORPORATION, Santa Clara, CA (US)

(72) Inventors: Glenn A. Glass, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/327,194

(22) PCT Filed: Sep. 30, 2016

(86) PCT No.: PCT/US2016/054709
§ 371 (c)(1),
(2) Date: Feb. 21, 2019

(87) PCT Pub. No.: WO2018/063301
PCT Pub. Date: Apr. 5, 2018

(65) Prior Publication Data
US 2019/0189755 A1 Jun. 20, 2019

(51) Int. Cl.
*H01L 29/167* (2006.01)
*H01L 29/775* (2006.01)
(Continued)

(52) U.S. Cl.
CPC ............ *H01L 29/167* (2013.01); *B82Y 10/00* (2013.01); *H01L 21/823821* (2013.01);
(Continued)

(58) Field of Classification Search
None
See application file for complete search history.

(56) References Cited

U.S. PATENT DOCUMENTS 5,091,763 A * 2/1992 Sanchez ................ H01L 21/266
257/344
5,635,416 A * 6/1997 Chen ................ H01L 27/11526
257/E21.687
(Continued)

FOREIGN PATENT DOCUMENTS

JP 2009105195 A 5/2009
TW 201628155 8/2016
WO 2018063301 A1 4/2018

OTHER PUBLICATIONS

International Search Report and Written Opinion received for PCT/US2016/054709, dated Jun. 29, 2017. 13 pages.
(Continued)

*Primary Examiner* — Nicholas J Tobergte
*Assistant Examiner* — Kevin Quinto
(74) *Attorney, Agent, or Firm* — Schwabe, Williamson & Wyatt, P.C.

(57) ABSTRACT

Techniques are disclosed for forming transistors including source and drain (S/D) regions employing double-charge dopants. As can be understood based on this disclosure, the use of double-charge dopants for group IV semiconductor material (e.g., Si, Ge, SiGe) either alone or in combination with single-charge dopants (e.g., P, As, B) can decrease the energy barrier at the semiconductor/metal interface between the source and drain regions (semiconductor) and their respective contacts (metal), thereby improving (by reducing) contact resistance at the S/D locations. In some cases, the double-charge dopants may be provided in a top or cap S/D portion of a given S/D region, for example, so that the double-charge doped S/D material is located at the interface of that S/D region and the corresponding contact. The double-charge dopants can include sulfur (S), selenium (Se), and/or tellurium (Te). Other suitable group IV material (Continued)

double-charge dopants will be apparent in light of this disclosure.

16 Claims, 7 Drawing Sheets

(51) Int. Cl.
  *H01L 29/161* (2006.01)
  *H01L 29/08* (2006.01)
  *H01L 29/417* (2006.01)
  *H01L 29/66* (2006.01)
  *H01L 29/739* (2006.01)
  *H01L 29/78* (2006.01)
  *H01L 29/786* (2006.01)
  *H01L 21/8238* (2006.01)
  *H01L 27/092* (2006.01)
  *B82Y 10/00* (2011.01)
  *H01L 27/088* (2006.01)
  *H01L 29/423* (2006.01)

(52) U.S. Cl.
  CPC ...... *H01L 27/0886* (2013.01); *H01L 27/0924* (2013.01); *H01L 29/0847* (2013.01); *H01L 29/161* (2013.01); *H01L 29/41725* (2013.01); *H01L 29/42392* (2013.01); *H01L 29/66* (2013.01); *H01L 29/66356* (2013.01); *H01L 29/66439* (2013.01); *H01L 29/66795* (2013.01); *H01L 29/7391* (2013.01); *H01L 29/775* (2013.01); *H01L 29/785* (2013.01); *H01L 29/7851* (2013.01); *H01L 29/78618* (2013.01); *H01L 29/78696* (2013.01); *H01L 29/0834* (2013.01); *H01L 29/66545* (2013.01)

(56) References Cited

U.S. PATENT DOCUMENTS

| | | | | |
|---|---|---|---|---|
| 5,773,863 A | * | 6/1998 | Burr | H01L 29/1045 257/344 |
| 9,577,102 B1 | * | 2/2017 | Hsaio et al. | H01L 21/28 |
| 2004/0217420 A1 | | 11/2004 | Yeo et al. | |
| 2005/0167001 A1 | * | 8/2005 | Krautbauer | C30B 29/08 148/33 |
| 2006/0071275 A1 | * | 4/2006 | Brask | H01L 29/66795 257/350 |
| 2011/0215375 A1 | | 9/2011 | Cook, Jr. et al. | |
| 2012/0319211 A1 | | 12/2012 | van Dal et al. | |
| 2014/0027783 A1 | * | 1/2014 | Yin et al. | H01L 21/8234 257/77 |
| 2014/0065799 A1 | * | 3/2014 | Ahmed | H01L 21/3003 438/477 |
| 2015/0206953 A1 | * | 7/2015 | Basker et al. | H01L 29/66 257/192 |
| 2015/0249141 A1 | * | 9/2015 | Yu | H01L 29/165 257/77 |
| 2016/0211276 A1 | | 7/2016 | Liu et al. | |
| 2017/0110541 A1 | * | 4/2017 | Xu | H01L 21/26506 |

OTHER PUBLICATIONS

International Preliminary Report on Patentability received for PCT/US2016/054709. dated Apr. 2, 2019. 9 pages.

Erteken, et al., Insulator-to-Metal Transition in Selenium-Hyperdoped Silicon: Observation and Origin Phys. Rev. Lett. 108, 026401, Published Jan. 11, 2012. 1 page.

Erteken, et al., Insulator-to-Metal Transition in Selenium-Hyperdoped Silicon: Observation and Origin. Phys. Rev. Lett. 108, 026401, Published Jan. 11, 2012. 5 pages.

Erteken, et al., Insulator-to-Metal Transition in Selenium-Hyperdoped Silicon: Observation and Origin. Phys. Rev. Lett. 108, 026401, Published Jan. 11, 2012. 7 pages.

Office Action from Taiwan Patent Application No. 106128298, dated Mar. 17, 2021 11 pgs.

Office Action from Taiwan Patent Application No. 106128298, dated Nov. 24, 2021 16 pgs., with English translation.

Notice of Allowance from Taiwan Patent Application No. 106128298, dated Jul. 19, 2022, 3 pgs.

* cited by examiner

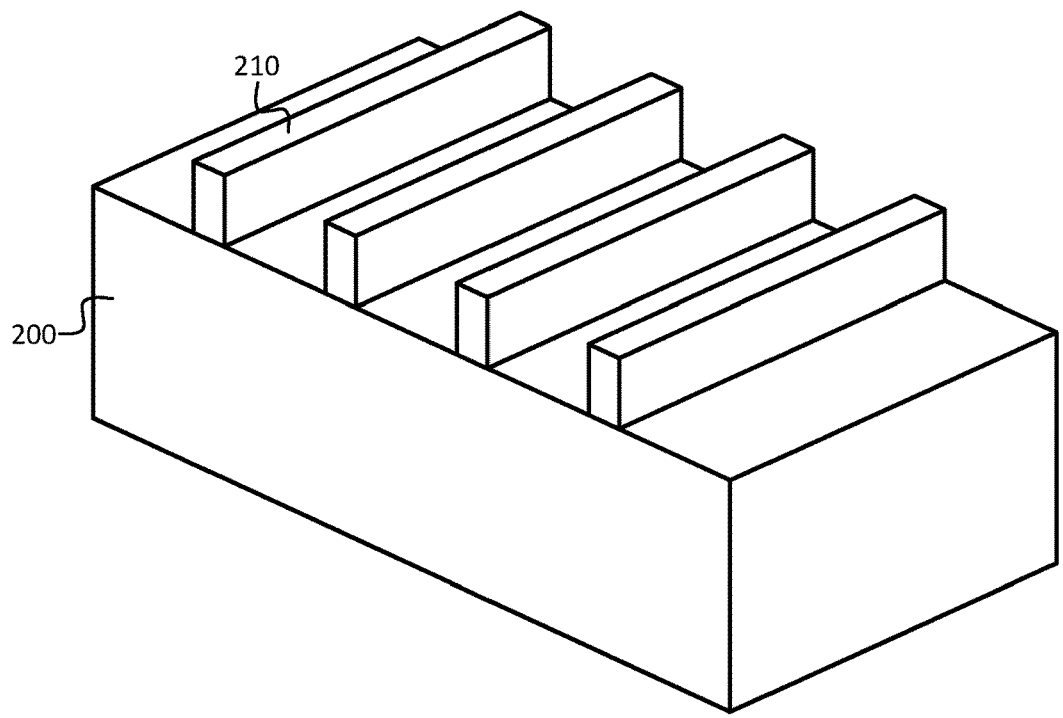
FIG. 2A
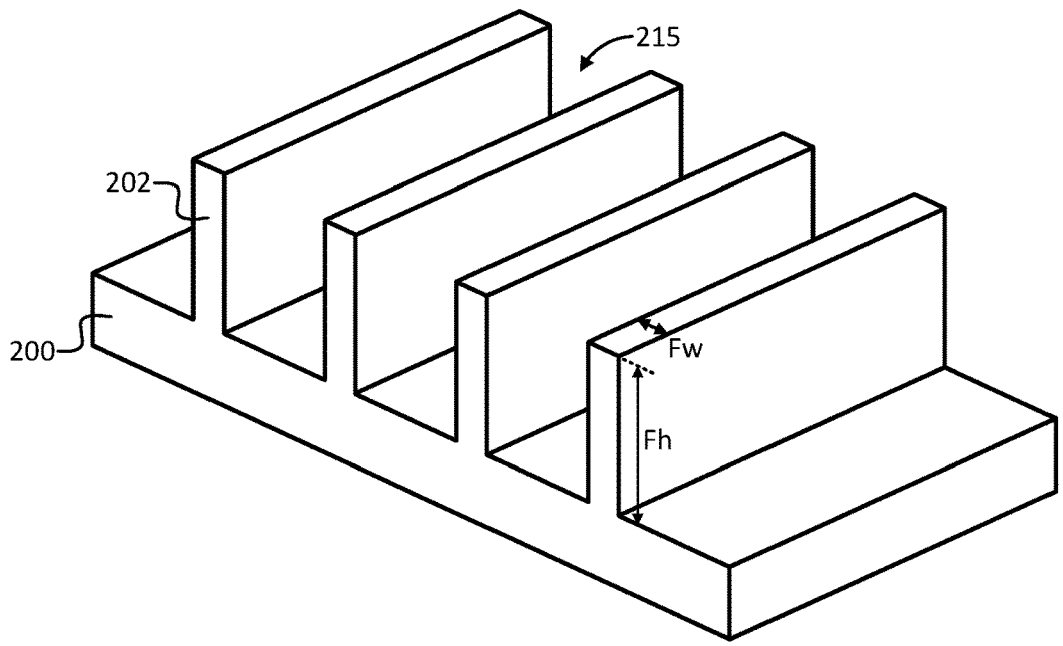
FIG. 2B
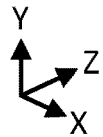

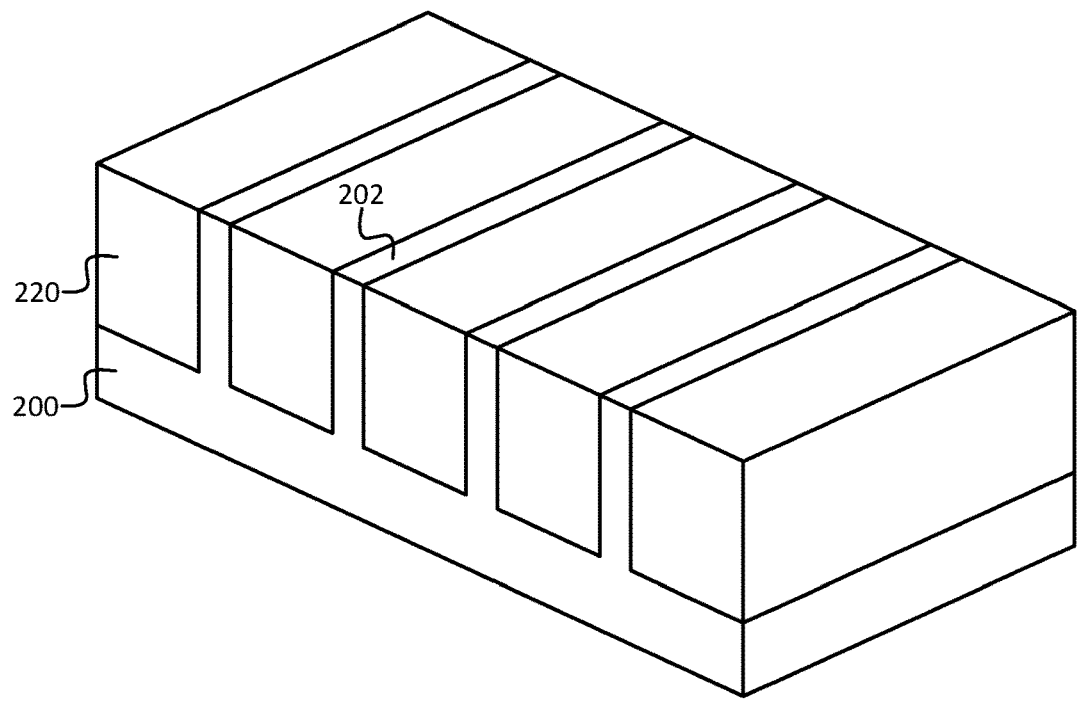
FIG. 2C
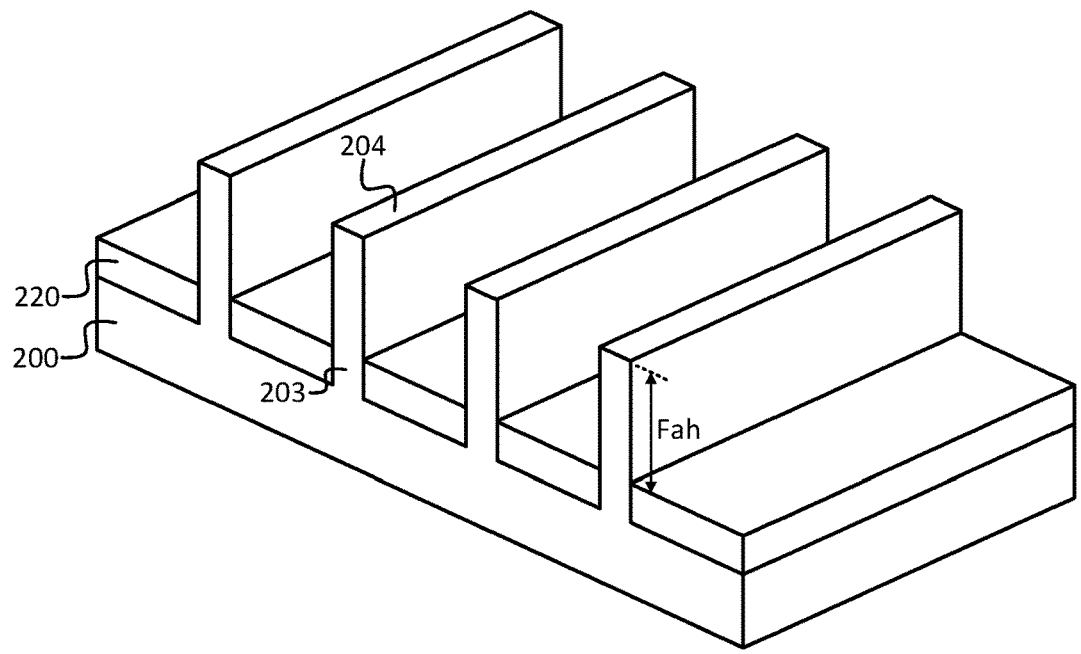
FIG. 2D
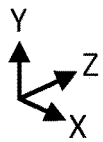

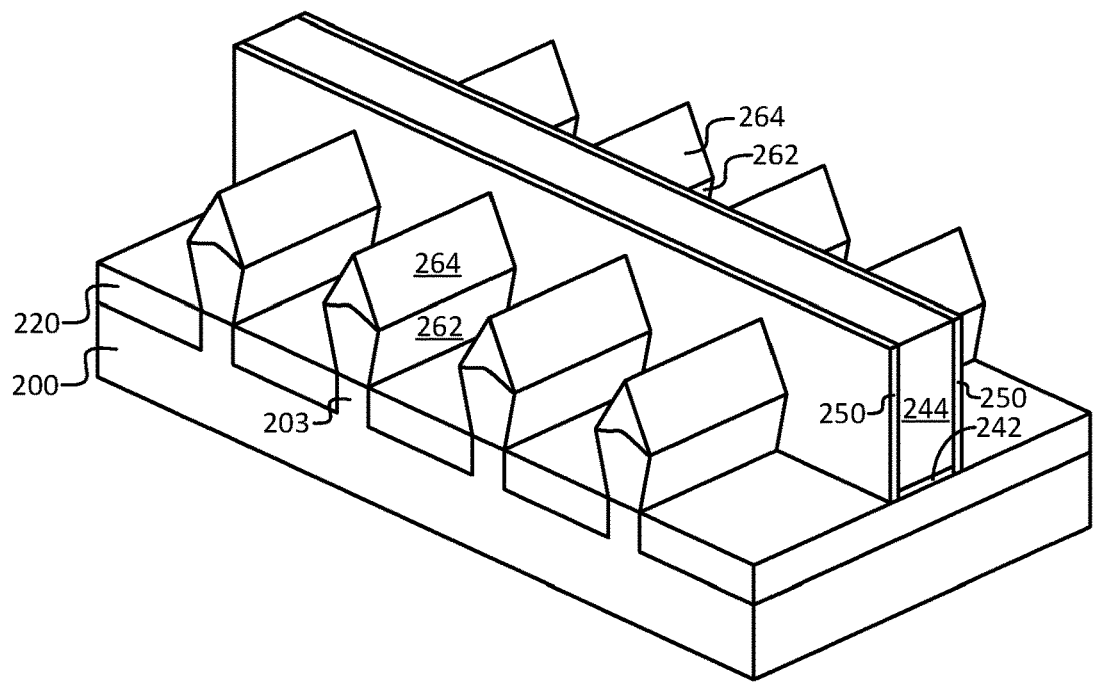
FIG. 2F
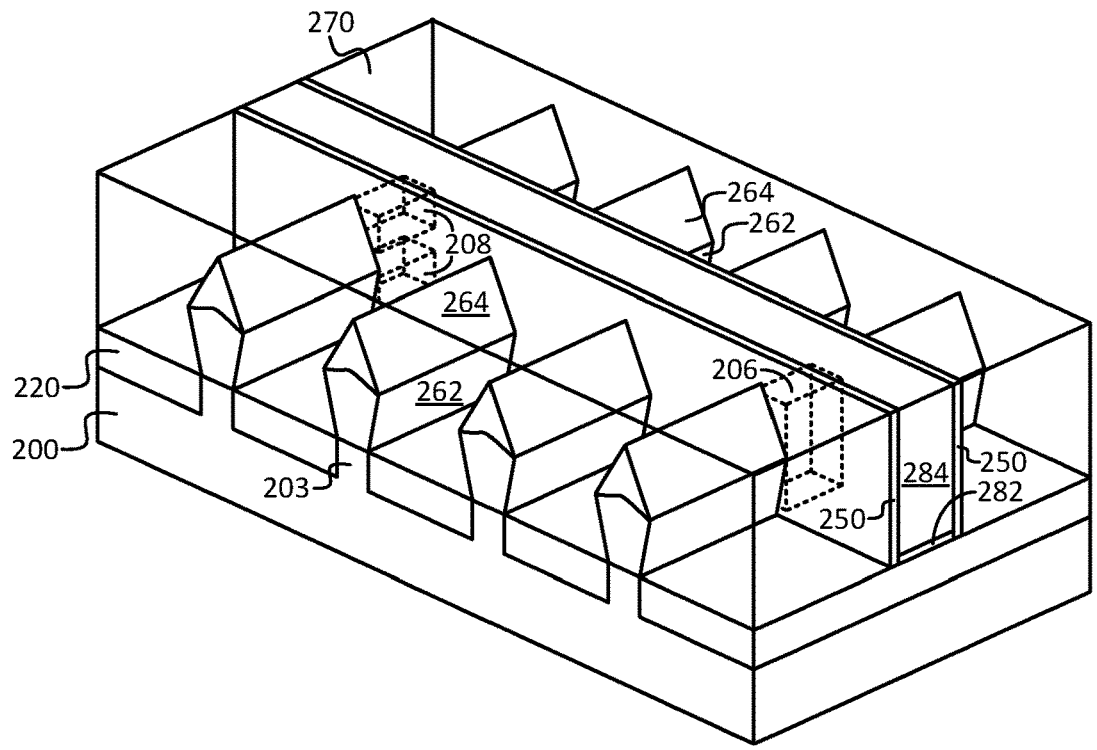
FIG. 2G
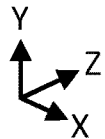

TRANSISTORS INCLUDING SOURCE/DRAIN EMPLOYING DOUBLE-CHARGE DOPANTS

CROSS-REFERENCE TO RELATED APPLICATIONS

This patent application is a U.S. National Phase Application under 35 U.S.C. § 371 of International Application No. PCT/US2016/054709, filed on Sep. 30, 2016, the entire contents of which is hereby incorporated by reference herein.

BACKGROUND

Semiconductor devices are electronic components that exploit the electronic properties of semiconductor materials, such as silicon, germanium, and gallium arsenide. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric layer between the gate and the channel. Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 2A-H illustrate example integrated circuit structures that are formed when carrying out method of FIG. 1, in accordance with various embodiments.

FIG. 2D' illustrates the example structure of FIG. 2D, including vertical isolation structures, in accordance with an embodiment.

FIG. 2H' illustrates the example structure of FIG. 2H, including the vertical isolation structures of FIG. 2D', in accordance with an embodiment.

Figure 1:
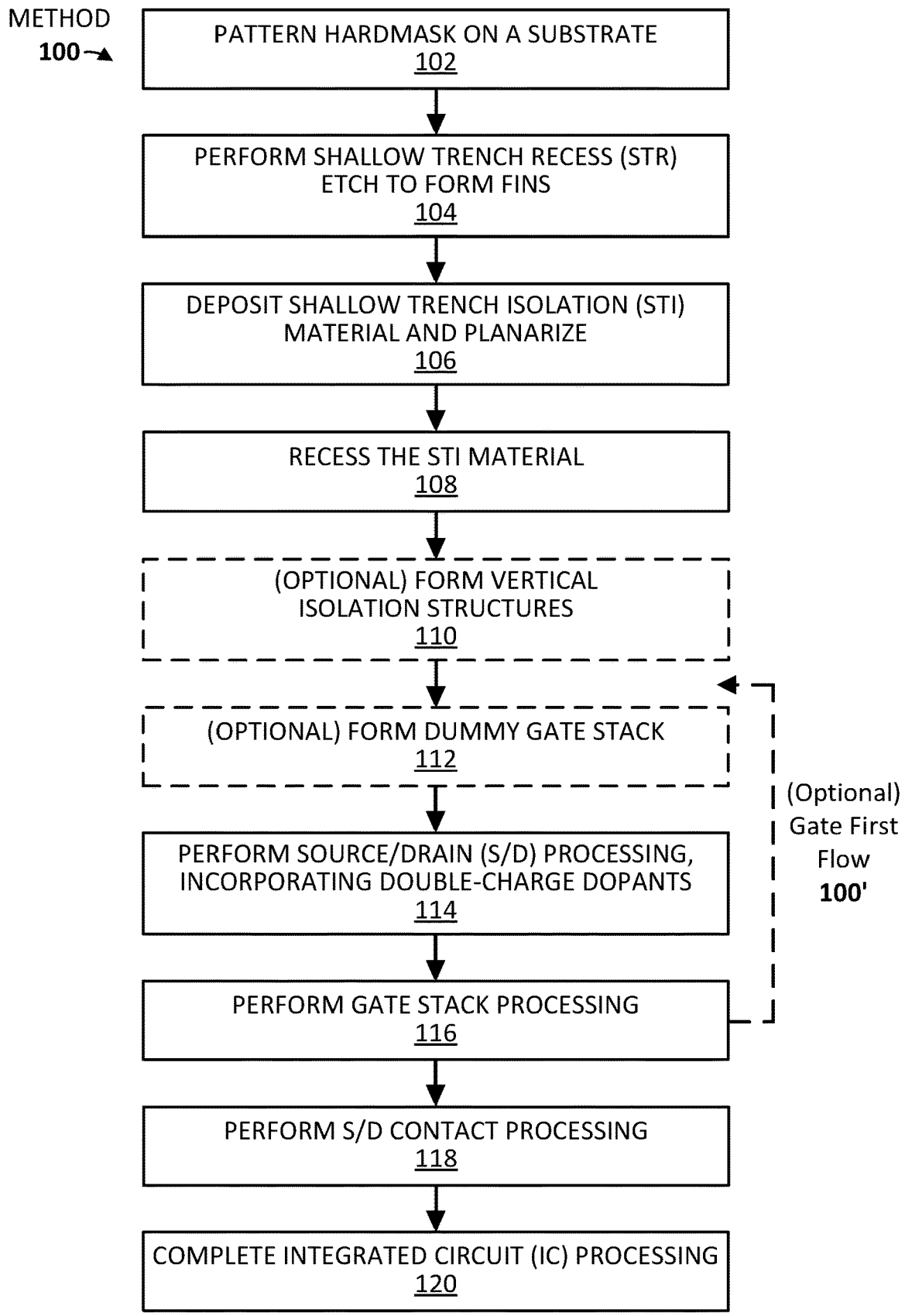
FIG. 1 illustrates a method of forming an integrated circuit including one or more transistors including source/drain (S/D) employing double-charge dopants, in accordance with one or more embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

Source/drain (S/D) contact resistance is a limiting factor in transistor performance, such as in the performance of field-effect transistors (FETs). Such S/D contact resistance can be considered a component of external resistance (Rex or Rext). A technique for improving S/D contact resistance includes increasing the doping concentration of the typical n-type or p-type dopants near the S/D-contact interfaces (e.g., the source-source contact interface and the drain-drain contact interface). Such increased doping may be relatively very high, such as degenerate or near-degenerate doping levels (e.g., greater than 6E18 atoms per cubic centimeter (cm), in the example case of silicon). Typical dopants for group IV semiconductor materials (e.g., silicon (Si), germanium (Ge), SiGe) include phosphorous (P) and arsenic (As) for n-type dopants (donors) and boron (B) for p-type dopants (acceptors). However, such dopants (e.g., P, As, and B) are single-charge dopants that have degeneracy limits and also have limits with respect to the total decrease in the energy barrier that can be achieved at the S/D-contact interfaces.

Thus, and in accordance with one or more embodiments of the present disclosure, techniques are provided for forming transistors including source and drain (S/D) regions employing double-charge dopants. As can be understood based on this disclosure, the use of double-charge (or double-carrier) dopants either alone or in combination with single-charge (or single-carrier) dopants (e.g., P, As, and B) can decrease the energy barrier at the semiconductor/metal interface between the source and drain regions (semiconductor) and their respective contacts (metal), thereby improving (by reducing) contact resistance at the S/D locations. In some embodiments, the double-charge dopants may be introduced in a top portion of a given S/D region, such as in a cap formed on the main S/D material of that region, so that the double-charge doped S/D material is located at the interface of that S/D region and the corresponding contact, for example. In some such embodiments, the cap may be a distinct layer, while in other such embodiments, the cap that includes double-charge dopants may be a portion of the main S/D material, for example. In still other embodiments, the double-charge dopants may be included in the entirety of a given S/D region, rather than just proximate to the S/D-contact interface. In a more general sense, numerous S/D structures can be used, including multilayer structures (e.g., bi-layer construction having main portion and cap configuration) or a single continuous S/D layer having one or more graded components including a double-charge dopant that is graded into the S/D structure somewhere near the contact interface. In some embodiments, the double-charge dopants for group IV S/D semiconductor materials include sulfur (S), selenium (Se), tellurium (Te), or some combination of these.

Note that group IV semiconductor material (or group IV material or IV material) as used herein includes at least one group IV element (e.g., carbon, silicon, germanium, tin, lead), such as silicon (Si), germanium (Ge), silicon germanium (SiGe), silicon germanium alloyed with carbon (SiGe:C), or germanium tin (GeSn) to name some examples. Also note that the double-charge dopants of S, Se, and/or Te can be used for both p-type and n-type doped S/D regions, and thus, the techniques described herein can be used for p-type transistor devices (e.g., p-MOS) and n-type transistor devices (e.g., n-MOS), in accordance with some embodiments. Further, the techniques described herein may be used to benefit complementary transistor circuits (such as CMOS circuits), where double-charge dopants of S, Se, and/or Te may be used to benefit one or both of the included n-type and p-type transistors making up the CMOS circuit. Further still, although the techniques disclosed herein are primarily described in the context of S/D regions including group IV semiconductor material (e.g., Si, Ge, SiGe), the techniques and principles may be applicable to other semiconductor material, such as using suitable double-charge dopants for S/D regions including group III-V semiconductor material, for example.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit including a transistor having at least S/D region including group IV semiconductor material and double-charge dopants (e.g., S, Se, and/or Te), as variously described herein. In some embodiments, the double-charge dopants may only be present in a portion of the given S/D region, such as in a cap or top portion, so that the double-charge dopants are at the interface of the S/D region and the corresponding S/D contact to reduce the resistance at that interface and improve the transistor performance, for example. In some embodiments, double-charge dopants may be located in the entirety of a given group IV semiconductor material S/D region; however, that need not be the case. Further, in some embodiments, typical single-charge dopants, such as phosphorous (P) and/or arsenic (As) for n-type doped group IV material or boron (B) for p-type doped group IV material regions, may also be present in the S/D regions. Further, in some embodiments, the total concentration of doping in at least a portion of the S/D regions may be very high such that that S/D portion is degenerately doped, whereby the doping concentration (of double-charge dopants or a combination of double-charge and single-charge dopants) is greater than 1E18, 1E19, 1E20, 5E20, 1E21, or 5E21 atoms per cubic cm, or some other suitable threshold concentration as will be apparent in light of this disclosure. Numerous configurations and variations will be apparent in light of this disclosure.

Architecture and Methodology

Figure 2D:
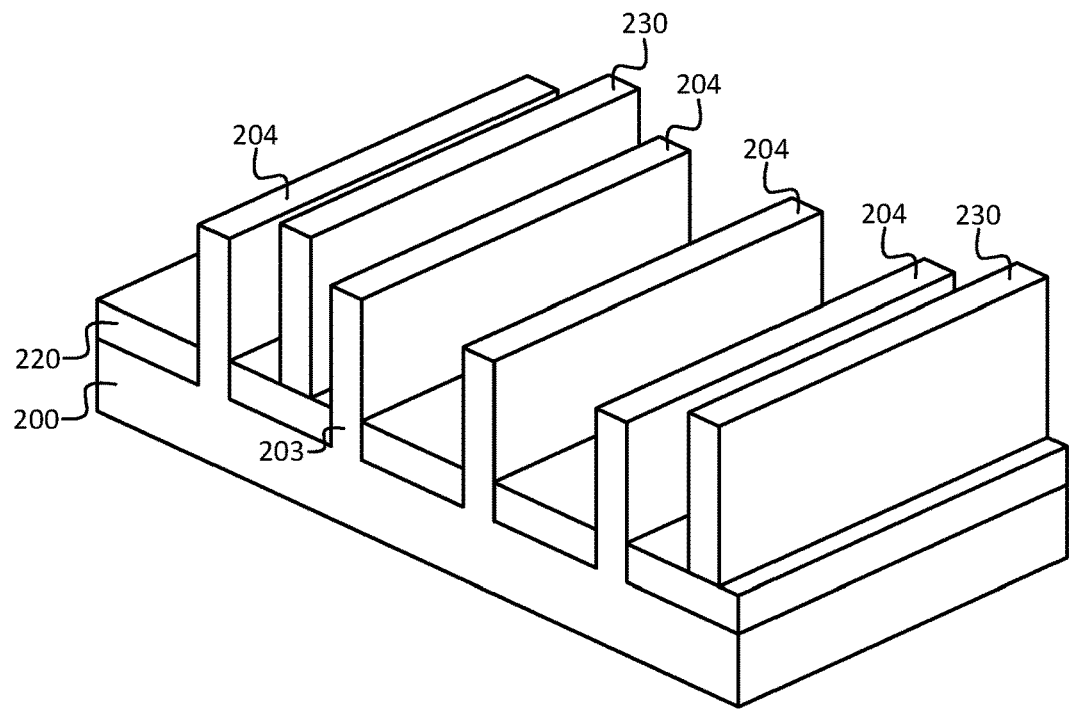

FIG. 1 illustrates a method 100 of forming an integrated circuit including one or more transistors including source/drain (S/D) employing double-charge dopants, in accordance with one or more embodiments of the present disclosure. FIGS. 2A-H illustrate example integrated circuit structures that are formed when carrying out method 100 of FIG. 1, in accordance with various embodiments. The inclusion of double-charge dopants in the S/D regions provides benefits as can be understood based on this disclosure, such as improving (by reducing) S/D contact resistance. Method 100 of FIG. 1 includes a primary vertical flow that illustrates a gate last transistor fabrication process flow, in accordance with some embodiments. However, in other embodiments, a gate first process flow may be used, as will be described herein (and which is illustrated with the alternative gate first flow 100' indicator in FIG. 1). The structures of FIGS. 2A-H are primarily depicted and described herein in the context of forming finned transistor configurations (e.g., FinFET or tri-gate), for ease of illustration. However, the techniques can be used to form transistors of any suitable geometry or configuration, depending on the end use or target application. For example, FIG. 2G illustrates an example integrated circuit structure including transistors having nanowire configurations, as will be described in more detail below.

Various example transistors that can benefit from the techniques described herein include, but are not limited to, field-effect transistors (FETs), metal-oxide-semiconductor FETs (MOSFETs), tunnel-FETs (TFETs), planar configuration transistors, finned configuration transistors (e.g., FinFET, tri-gate), and nanowire (or nanoribbon or gate-all-around) configuration transistors. In addition, the techniques can be used to benefit p-type devices (e.g., p-MOS and p-TFET) and/or n-type devices (e.g., n-MOS and n-TFET). Further, the techniques may be used to form complementary MOS (CMOS) and/or complementary TFET (CTFET) transistors/devices/circuits, where either or both of the included p-type and n-type transistors may include double-charge dopants in the S/D regions as variously described herein. Other example transistor devices include few to single electron quantum transistor devices, for example. Further still, such devices may employ semiconductor materials that are three dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Method 100 of FIG. 1 includes patterning 102 hardmask 210 on a substrate 200 to form the example resulting structure shown in FIG. 2A, in accordance with an embodiment. Hardmask 210 may be formed or deposited on substrate 200 using any suitable technique, as will be apparent in light of this disclosure. For example, hardmask 210 may be blanket deposited or otherwise grown on substrate 200 using chemical vapor deposition (CVD), atomic layer deposition (ALD), physical vapor deposition (PVD), spin-on processing, and/or any other suitable process to form hardmask 210 on substrate 200. In some instances, the top surface of substrate 200 on which hardmask 210 is to be deposited may be treated (e.g., chemical treatment, thermal treatment, etc.) prior to deposition of the hardmask 210 material. Hardmask 210 can be patterned 102 using any suitable techniques, such as one or more lithography and etch processes, for example. Hardmask 210 may include of any suitable material, such as various oxide or nitride materials, for example. Specific oxide and nitride materials may include silicon oxide, titanium oxide, hafnium oxide, aluminum oxide, silicon nitride, or titanium nitride, just to name a few. In some cases, the hardmask 210 material may be selected based on the material of substrate 200, for example.

Substrate 200, in some embodiments, may include: a bulk substrate including group IV semiconductor material, such as silicon (Si), germanium (Ge), silicon germanium (SiGe), or silicon carbide (SiC), and/or at least one group III-V material and/or any other suitable material(s) as will be apparent in light of this disclosure; an X on insulator (XOI) structure where X is one of the aforementioned materials (e.g., group IV and/or group III-V) and the insulator material is an oxide material or dielectric material or some other electrically insulating material; or some other suitable multilayer structure where the top layer includes one of the aforementioned materials (e.g., group IV and/or group III-V). Note that group IV semiconductor material (or group IV material or IV material) as used herein includes at least one group IV element (e.g., carbon, silicon, germanium, tin, lead), such as Si, Ge, SiGe, or SiC to name some examples. Note that group III-V semiconductor material (or group III-V material or III-V material) as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. In some embodiments, substrate 200 may include a surface crystalline orientation described by a Miller Index of <100>, <110>, or <111>, or its equivalents, as will be apparent in light of this disclosure. Although substrate 200, in this example embodiment, is shown as having a thickness (dimension in the Y-axis direction) similar to other layers for ease of illustration, in some instances, substrate 200 may be much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

Method 100 of FIG. 1 continues with performing 104 shallow trench recess (STR) etch to form fins 202 from substrate 200, thereby forming the resulting example structure shown in FIG. 2B, in accordance with an embodiment. The STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ, for example. Trenches 215 may be formed with varying widths (dimension in the X-axis direction) and depths (dimension in the Y-axis direction) as can be understood based on this disclosure. For example, multiple hardmask patterning 102 and STR etching 104 processes may be performed to achieve varying depths in the trenches 215 between fins 202. Fins 202 may be formed to have varying widths Fw (dimension in the X-axis direction) and heights Fh (dimension in the Y-axis direction). For example, in an aspect ratio trapping (ART) integration scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects, if such an ART scheme is used.

In some embodiments, the fin widths Fw may be in the range of 5-400 nm, for example, or any other suitable value, as will be apparent in light of this disclosure. In some embodiments, the fin heights Fh may be in the range of 10-800 nm, for example, or any other suitable value, as will be apparent in light of this disclosure. In embodiments employing an aspect ratio trapping (ART) scheme, the fins may be formed to have particular height to width ratios such that when they are later recessed and/or removed, the resulting fin trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio of the fins (Fh:Fw) may be greater than 1, such as greater than 1.5, 2, 2.5, 3, 3.5, 4, 4.5, 5, 6, 7, 8, 9, or 10, or any other suitable threshold ratio, as will be apparent in light of this disclosure. Note that the trenches 215 and fins 202 are each shown as having the same widths and depths/heights in this example structure for ease of illustration; however, the present disclosure is not intended to be so limited. For example, in some embodiments, the fins 202 may be formed to have varying heights Fh and/or varying widths Fw. Further note that although four fins 202 are shown in the example structure of FIG. 2B, any number of fins may be formed, such as one, two, ten, hundreds, thousands, millions, and so forth, as can be understood based on this disclosure.

Method 100 of FIG. 1 continues with depositing 106 shallow trench isolation (STI) layer 220 and planarizing to form the resulting example structure shown in FIG. 2C, in accordance with an embodiment. In some embodiments, deposition 106 of STI layer 220 may include any deposition process described herein (e.g., CVD, ALD, PVD), or any other suitable deposition process. The material of STI layer 220 may include any suitable insulating material, such as one or more dielectric, oxide (e.g., silicon dioxide), or nitride (e.g., silicon nitride) materials. In some embodiments, the material of STI layer 220 may selected based on the material of substrate 200. For instance, in the case of a Si substrate, STI material may be silicon dioxide or silicon nitride, to provide an example.

Method 100 of FIG. 1 continues with recessing 108 the STI material 220 to cause at least a portion 204 of fins 202 to exude from the STI plane, thereby forming the resulting example structure shown in FIG. 2D, in accordance with an embodiment. As shown in FIG. 2D, the portion 204 of fin 202 exuding above the top plane of STI layer 220 (indicated as 204) has an active fin height indicated as Fah, which may be in the range of 10-750 nm, for example, or any other suitable value, as will be apparent in light of this disclosure. As is also shown, the portion 203 of fin 202 that is below the top plane of STI layer 220 is the sub-fin portion (indicated as 203). Note that in this example embodiment, fins 202 (including portions 203 and 204) are native to substrate 200. In other words, fins 202 were formed from substrate 200 in this example embodiment and include the same material in the structure of FIG. 2D, such that fins 202 (including portions 203 and 204) and substrate 200 are one homogenous structure. However, in other embodiments, some or all of fins 202 may be removed and replaced with replacement fins, for example. In some such embodiments, the processing may continue from the structure of FIG. 2C and include etching the fins 202 (e.g., using any suitable wet and/or dry etch processes) to form fin trenches between STI layer 220, where the etching either completely or partially removes fins 202 (e.g., either goes all the way to/past the bottom plane of STI layer 220 or does not, respectively). In such an embodiment, the fin trenches can be used for the deposition of a replacement material, and continuing with recess process 108 would result in the fins of FIG. 2D being replacement fins (which may include different material than what is included in substrate 200). In some such embodiments, the replacement material may include group IV semiconductor material and/or group III-V semiconductor material, and/or any other suitable material as will be apparent in light of this disclosure. For instance, replacement fins including SiGe may be formed by removing native Si fins during such processing and replacing them with the SiGe material, to provide an example. Note that in some such embodiments where the fins are removed and replaced (and thus, are not native fins), an ART processing scheme may be employed, where the fin trenches have a high aspect ratio (e.g., height:width ratio of greater than 1, 1.5, 2, 3, 4, 5, or a higher value). Such an ART processing scheme may be employed, for example to trap dislocations, thereby preventing the dislocations from reaching the epitaxial film surface and greatly reducing the surface dislocation density within the trenches.

Regardless of whether active fin portions 204 are native to substrate 200 or not, method 100 of FIG. 1 may optionally continue with forming 110 vertical isolation structures 230 as shown in FIG. 2D', in accordance with an embodiment. As can be understood based on this disclosure, FIG. 2D' illustrates the example structure of FIG. 2D, including vertical isolation structures 230. Therefore, the previous relevant description with respect to the example structure of FIG. 2D is equally applicable to the example structure of FIG. 2D'. In some embodiments, vertical isolation structures 230 may be formed to, for example, further isolate (or electrically insulate) single fins or groups of fins. For instance, in the example structure of FIG. 2D', such vertical isolation structures are present and may be included to prevent the eventual S/D regions of one transistor device from shorting the S/D of another (e.g., adjacent) transistor device by ensuring the respective S/D regions stay separate. Accordingly, such vertical isolation structures 230 may be formed using any suitable techniques and, when present the structures 230 may include any suitable electrical insulator material, such as a dielectric, oxide, nitride, and/or carbide material, for instance. Note that although the vertical isolation structures 230 are higher (dimension in the Y-axis direction) than fins 204, the present disclosure is not intended to be so limited. Also, because vertical isolation structure 230 need not be present in some disclosure, as they are optional, method 100 will continue to be described using IC structures without the vertical isolation structures 230, for ease of description.

Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 112—forming a dummy gate stack—would not be performed, and thus, process 112 is optional in some embodiments (such as those employing the gate first process flow). This is reflected on the right side of the process flow of FIG. 1, where performing 116 the final gate stack processing 116 may be performed prior to performing 114 the S/D processing, for example. However, the description of method 100 will continue using a gate last process flow, to allow for such a flow (which may include additional processes) to be adequately described.

Figure 2E:
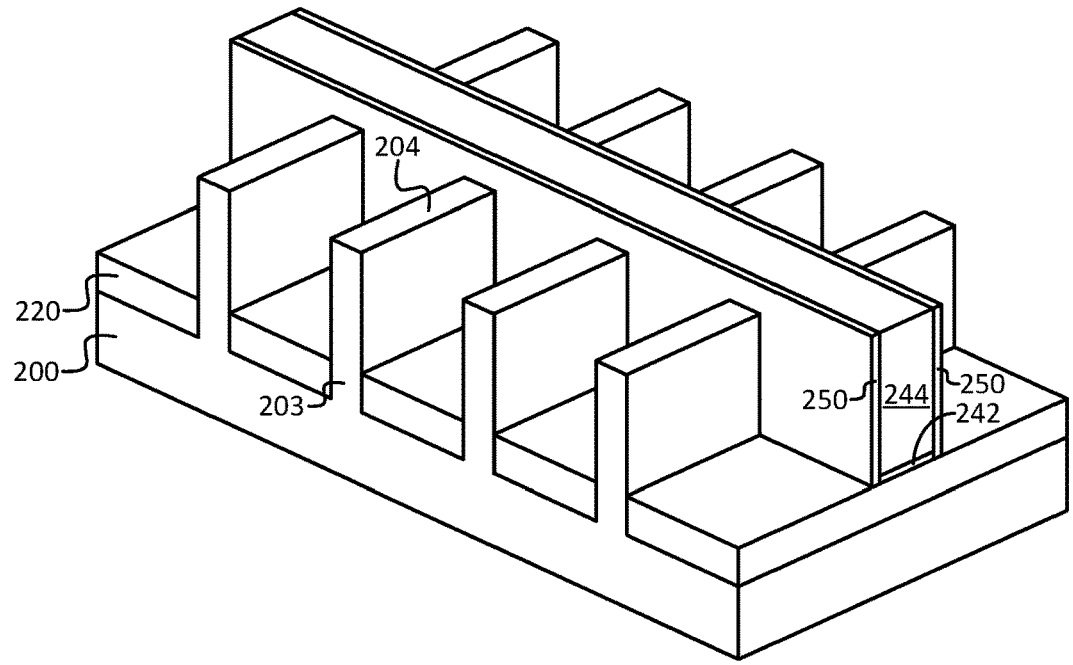

Method 100 of FIG. 1 continues with forming 112 a dummy gate stack, including dummy gate dielectric 242 and dummy gate electrode 244, thereby forming the example resulting structure of FIG. 2E, in accordance with an embodiment. As described above, process 112 is optional, because it need not be performed in all embodiments (such as those employing a gate first process flow). In this example embodiment, dummy gate dielectric 242 (e.g., dummy oxide material) and dummy gate or dummy gate electrode 244 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and can help with replacement gate processes, for example. As can be understood based on this disclosure, the dummy gate stack (and spacers 250) help define the channel region and source/drain (S/D) regions of each fin, where the channel region is below the dummy gate stack (as it will be located below the final gate stack), and the S/D regions are on either side of the dummy gate stack. Note that because the IC structures are being described in the context of forming finned transistors, the final gate stack will also be adjacent to either side of the fin, as the gate stack will reside along three walls of the finned channel regions, in some embodiments. Formation of the dummy gate stack may include depositing the dummy gate dielectric material 242 and dummy gate electrode material 244, patterning the dummy gate stack, depositing gate spacer material 250, and performing a spacer etch to form the structure shown in FIG. 2E, for example. Spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, the techniques described herein need not include forming a dummy gate stack, such that a final gate stack may be formed in the first instance. Regardless, the end structure will include the end gate stack, as will be apparent in light of this disclosure. Also note that in some embodiments, a hardmask (not shown) may be formed over the dummy gate stack (which may also be formed over spacers 250) to protect the dummy gate stack during subsequent processing, for example.

Method 100 of FIG. 1 continues with performing 114 source/drain (S/D) processing to form the example resulting structure of FIG. 2F, in accordance with an embodiment. As shown in FIG. 2f, the structure includes S/D regions that have a main portion 262 and cap portion 264, in this example embodiment. The S/D regions, in some embodiments, may be formed using any suitable techniques, such as masking regions outside of the S/D regions to be processed, etching portions of the fins from the structure of FIG. 2E (in this example case, active portions 204 were etched and removed, leaving only sub-fin portions 203, as shown), and forming/depositing/growing the S/D regions (e.g., using any suitable techniques, such as CVD, ALD, PVD), including main portion 262 and cap portion 264, for example. However, in some embodiments, the native fin 204 material (i.e., native to substrate 200) may remain in the S/D regions, where such native material is doped to form the final S/D regions. In some such embodiments, the S/D regions may or may not include an additional cap portion (such as cap 264). Thus, the material of the main S/D portion 262 may be native or replacement material, such that there may or may not be a distinct interface between the sub-fin portions 203 and the main S/D portions 262. In this example embodiment, as the material of the main S/D portion 262 is replacement material, there is a distinct interface between features 262 and 203, as shown in FIG. 2F. Note that in some instances, where the main S/D portion 262 includes native material, there may still be a distinct interface between the main S/D portion 262 and the sub-fin 203, because of the impurity dopants introduced into the main S/D portion, for example. In some embodiments, main S/D portion 262 and/or S/D cap 264 may have a multi-layer structure including multiple material layers, for example. In some embodiments, main S/D portion 262 and/or S/D cap portion 264 may include grading (e.g., increasing and/or decreasing) the content/concentration of one or more materials in some or all of the portion(s).

In some embodiments, the S/D regions may be formed one polarity at a time, such as performing processing for one of n-type and p-type S/D regions, and then performing processing for the other of the n-type and p-type S/D regions. In some embodiments, the S/D regions may include any suitable material, such as group IV material (e.g., Si, SiGe, Ge) or any other suitable material, and may include any suitable doping scheme, as will be apparent in light of this disclosure. In embodiments, where corresponding S/D regions on either side of the channel region (e.g., on either side of the gate stack) are to be used for a MOSFET device, the S/D regions may include the same type of dopants in a source-channel-drain doping scheme of either p-n-p (e.g., for p-MOS) or n-p-n (e.g.. for n-MOS), where 'n' represents n-type doping and 'p' represents p-type doping, for example. In embodiments where corresponding S/D regions on either side of the channel region (e.g., on either side of the gate stack) are to be used for a TFET device, the S/D regions may include opposite types of dopants in a source-channel-drain scheme of either p-i-n (e.g., for p-TFET) or n-i-p (e.g., for n-TFET), where 'i' represents intrinsic material (e.g., undoped or relatively minimally doped, such as doping concentration of less than 1E16 atoms per cubic cm), for example. In some embodiments, a multitude of transistor types, and thus, S/D schemes may be employed. For instance, in the structure of FIG. 2F, the four sets of S/D regions may include doping configurations that are all the same, some the same, or none the same, as can be understood based on this disclosure (note that in FIG. 2F, only one S/D region set is indicated for ease of illustration, which is the set that is the second from the left). Further, the S/D regions may include double-charge dopants (e.g., S, Se, and/or Te), in some embodiments, as will be described in more detail below.

In some embodiments, the S/D regions (which, in the example embodiment of FIG. 2F, each include main S/D portion 262 and S/D cap portion 264) may be doped, as previously stated. Such doping intentionally introduces impurities in a semiconductor material to, for example, modulate the electrical properties of the semiconductor material. Therefore, such impurity doping may be used to change the electrical properties of the group IV semiconductor material of the S/D regions, in some embodiments. In some embodiments, the S/D regions may be doped using any suitable techniques, such as via ion implantation and/or depositing the dopants with the primary group IV semiconductor material, and/or any other suitable techniques as will be apparent in light of this disclosure. In embodiments where implantation is used, the implantation of the dopants could be into native and/or replacement S/D material, for example. Further, in embodiments where implantation is used, the impurity dopants may be implanted with or without preamorphizing treatments, for example. Any number of doping processes may be performed as desired to introduce double-charge and/or single-charge dopants in the primary group IV semiconductor material of one or more S/D regions, as will be apparent in light of this disclosure.

In some embodiments, double-charge dopants may be formed in, and thus included in, one or more S/D regions, which may include the corresponding S/D portion 262 and S/D cap portion 264, for example. As the primary material in the S/D regions is group IV semiconductor material, suitable double-charge dopants include, but are not limited to, sulfur (S), selenium (Se), and tellurium (Te). In some embodiments, double-charge dopants (e.g., S, Se, and/or Te) may be only present in S/D cap portion 264 for a given S/D region, while in other embodiments, the double-charge dopants may also be present in main S/D portion 262, for example. Recall that in some embodiments, S/D regions need not include cap portion 264, such that the S/D regions may be configured differently. Regardless of the configuration, double-charge dopants (e.g., S, Se, and/or Te) may be present in at least a portion of a given S/D region, such as at least the portion in physical contact with the respective S/D contact (or an intervening layer between the S/D contact and the S/D region, such as an adhesion layer), for example. Double-charge dopants (e.g., S, Se, and/or Te) may be present in a given S/D region (whether in the entirety of the given S/D region or only in a portion, such as just the S/D cap portion 264) in any desired concentration, such as in a concentration in the range of 1E15 to 1E22 atoms per cubic centimeter (cm) (e.g., in the range of 5E19 to 5E21 atoms per cubic cm), or any other suitable concentration as will be apparent in light of this disclosure. In an example embodiment, the double-charge dopant concentration may be approximately 2E20 atoms per cubic cm (e.g., 2E20 plus/minus 1E20 atoms per cubic cm). Inclusion of double-charge dopants (e.g., S, Se, and/or Te) in the group IV semiconductor material of an S/D region can benefit both n-type and p-type S/D, as can be understood based on this disclosure. Note that in some embodiments, double-charge dopants may only be present in one of the source and drain regions of a transistor device, and not in both, for example. For instance, in the case of a TFET device, in an example embodiment, double-charge dopants may only be present in one of the S/D polarities, and because TFETs have a source-channel-drain configuration of p-i-n or n-i-p, the double-charge dopants would only be in one of the source and drain regions of the TFET device and not the other, in this specific example embodiment.

In some embodiments, typical single-charge dopants may also be included in one or more of the S/D regions, which may include the corresponding main S/D portion 262 and/or S/D cap portion 264, for example. Recall that typical single-charge dopants for group IV semiconductor material (e.g., Si, SiGe, Ge) includes phosphorous (P) and arsenic (As) for n-type dopants (donors) and boron (B) for p-type dopants (acceptors); although, other suitable single-charge dopants may be known to those in the art. However, such single-charge dopants need not be present in both the main S/D portion 262 and the S/D cap portion 264 for a given S/D region, but may only be present in one of the portions. Further, in some embodiments, only double-charge dopants (e.g., S, Se, and/or Te) may be present in a given S/D region. In embodiments where single-charge dopants are included in a given S/D region, they may be present (whether in the entirety of the given S/D region or only a portion, such as just the main S/D portion 262) in any desired concentration, such as in a concentration in the range of 1E15 to 1E22 atoms per cubic cm (e.g., in the range of 1E20 to 5E21 atoms per cubic cm), or any other suitable concentration as will be apparent in light of this disclosure. In some embodiments, using the structure of FIG. 2F, a main S/D portion 262 of a given S/D region may only be doped with typical single-charge dopants and S/D cap portion 264 may be doped with only double-charge dopants or with double-charge dopants and single-charge dopants, to provide some example configurations. Note that during the doping processing and/or as a result of subsequent processing, dopants in a portion of the S/D region may diffuse into another portion of the S/D region, in some cases. For instance, in an example embodiment, where double-charge dopants are introduced into the S/D cap portion 264 of a given S/D region but not into the main S/D portion 262 of that S/D region, some of the double-charge dopants may diffuse into the main S/D portion 262 in a smaller concentration than what is present in the S/D cap portion 264. In some embodiments, it may be desired to have the highest total carrier concentration and a continuous set of carrier states in the band gap between the double donor set of states and the conduction band, for example, as can be understood based on this disclosure.

In some embodiments, the level of doping in the semiconductor material may be very high such that the semiconductor material is what is referred to as degenerately doped, whereby the semiconductor material starts to act more like a conductor (e.g., a metal) than a semiconductor, for instance (e.g., in the sense that electrical carriers are not capable of being frozen out at low temperatures). For instance, in some cases, group IV semiconductor material (e.g., Si) may be considered degenerately doped when impurity dopants (whether they be single-charge, double-charge, or some combination thereof) are present at a concentration of greater than 1E18, 1E19, 1E20, 5E20, 1E21, or 5E21 atoms per cubic cm, or some other suitable threshold doping level as will be apparent in light of this disclosure. In some embodiments, degenerate doping of the S/D cap portion 264 (or the portion of the S/D in physical contact with the S/D contacts, where S/D cap portions 264 are not present) may be desired to reduce contact resistance with the S/D contacts and thereby improve/enhance performance of the transistor. As can be understood based on this disclosure, in some embodiments, double-charge dopants (e.g., S, Se, and/or Te) may be added to S/D regions in addition to typical single-charge dopants (e.g., P, As, B) for group IV semiconductor material. In such embodiments, by using double-charge dopants (either alone or in addition to single-charge dopants), the degeneracy state of the dopant impurity band can be enhanced to reduce the S/D contact resistance. In other words, in such embodiments, using double-charge dopants can decrease the energy barrier at the S/D region-S/D contact interface, thereby improving contact resistance and improving transistor performance. As can be understood based on this disclosure, higher levels of doping degeneracy is able to be achieved by introducing double-charge dopants into the S/D region than what could be achieved by just using single-charge dopants.

Note that in some embodiments, the S/D regions need not include cap portions, such as portions 264 as shown in FIG. 2F. Thus, such cap portions are optional. For instance, in some embodiments, the double-charge dopants (e.g., S, Se, and/or Te) may be present in the main portion of the S/D, for example. In some such embodiments, the double-charge dopants may be present in the entirety of the main portion of the S/D (and thus, present in the entirety of the S/D regions), or the main portion of the S/D may be a multilayer and/or graded structure, such that the double-charge dopants are only in one layer of the multilayer S/D and/or the double-charge dopants are introduced in a graded fashion (e.g., with increased concentration of the dopants) at some point in the S/D material. However, regardless of how the double-charge dopants are included in the S/D regions, in some embodiments, to provide relatively enhanced contact resistance with the S/D contacts, the double-charge dopants should be at least in the portion of the S/D regions that physically contacts/touches the S/D contacts (which typically includes a metal material, as will be described in more detail herein). Numerous transistor S/D configurations and variations will be apparent in light of this disclosure.

Method 100 of FIG. 1 continues with performing 116 gate stack processing to form the example resulting structure of FIG. 2G. As shown in FIG. 2G, the processing in this example embodiment included depositing interlayer dielectric (ILD) layer 270 on the structure of FIG. 2F, followed by optional planarization and/or polishing to reveal the dummy gate stack. Note that ILD layer 270 is shown as transparent in the example structure of FIG. 2G to allow for the underlying features to be seen; however, the present disclosure is not intended to be so limited. In some embodiments, the ILD layer 270 may include any suitable electrical insulator, dielectric, oxide (e.g., silicon oxide), and/or nitride (e.g., silicon nitride) material, as will be apparent in light of this disclosure. The gate stack processing, in this example embodiment, continued with removing the dummy gate stack (including dummy gate 244 and dummy gate dielectric 242) to allow for the final gate stack to be formed. Recall that in some embodiments, the formation of the final gate stack, which includes gate dielectric layer 282 and gate (or gate electrode) 284, may be performed using a gate first flow (also called up-front hi-k gate). In such embodiments, the gate processing may have been performed after process 108 or after optional process 110 (in embodiments where process 110 is performed) and prior to the S/D processing 114. However, in this example embodiment, the gate stack is formed using a gate last flow (also called a replacement gate or replacement metal gate (RMG) process). In such gate last processing, the process may include dummy gate oxide deposition, dummy gate electrode (e.g., poly-Si) deposition, and, optionally, patterning hardmask deposition, as previously described. Regardless of whether gate first or gate last processing is employed, the final gate stack can include gate dielectric layer 282 and gate 284 as shown in FIG. 2G.

Note that when the dummy gate is removed, the channel region of fins 204 (that were covered by the dummy gate) are exposed to allow for any desired processing of the channel regions of the fins. Such processing of the channel region may include various different techniques, such as removing and replacing the channel region with replacement material, doping the channel region of the fin as desired, forming the fin into one or more nanowires (or nanoribbons) for a gate-all-around (GAA) transistor configuration, cleaning/polishing the channel region, and/or any other suitable processing as will be apparent in light of this disclosure. For instance, finned channel region 206 is illustrated (which is the channel region of the right most finned structure), which may have been formed by doping the native fin 204 with a desired suitable n-type or p-type dopant, for example. To provide another example, nanowire channel region 208 (which is the channel region of the left most finned structure) may have been formed after the dummy gate was removed and the channel regions of the fins were exposed, by converting the finned structure at that location using any suitable techniques, for example. As shown, nanowire channel region 208 includes 2 nanowires (or nanoribbons). However, a nanowire (or nanoribbon or GAA) transistor formed using the techniques disclosed herein may include any number of nanowires (or nanoribbons) such as 1, 2, 3, 4, 5, or more, depending on the desired configuration.

As can be understood based on this disclosure, the channel region is at least below the gate stack. For instance, in the case of a finned transistor configuration, the channel region may be below and between the gate stack, as the stack is formed on three sides as is known in the art. Further, in the case of a nanowire (or nanoribbon or GAA) transistor configuration, the gate stack may substantially (or completely) surround each nanowire/nanoribbon in the channel region. Further still, in the case of a planar transistor configuration, the gate stack may simply be above the channel region. In some embodiments, the channel region includes group IV semiconductor material, such as Si, Ge, SiGe, SiGe:C, and/or GeSn, to provide some examples. In some embodiments, the channel region may be doped (e.g., with any suitable n-type and/or p-type dopants) or undoped, depending on the particular configuration. Note that the S/D regions are adjacent to either side of the channel region, as can be seen in FIG. 2G, for example. Also note that the configuration/geometry of a transistor formed using the techniques described herein may primarily be described based on the shape/configuration of the respective channel region of that transistor, for example. For instance, a nanowire (or nanoribbon or GAA) transistor may be referred to as such because it includes one or more nanowires (or nanoribbons) in the channel region of that transistor. However, transistor type (e.g., MOSFET or TFET or other suitable type) may be described based on the doping and/or operating scheme of the source, drain, and channel, and thus those respective regions may be used to determine the type or classification of a given transistor, for example. This is especially true for MOSFET versus TFET transistors, as they may structurally be similar (or the same), but include different doping schemes (e.g., p-n-p or n-p-n versus p-i-n or n-i-p, respectively).

Continuing with performing 116 gate stack processing, after the dummy gate has been removed and any desired channel region processing has been performed, the final gate stack can be formed, in accordance with an embodiment. In this example embodiment, the final gate stack includes gate dielectric layer 282 and gate 284, as shown in FIG. 2G. The gate dielectric layer 282 may include, for example, any suitable oxide (such as silicon dioxide), high-k gate dielectric material, and/or any other suitable material as will be apparent in light of this disclosure. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric layer 282 to improve its quality when high-k material is used. The gate 284 (or gate electrode) may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric layer 282 and/or gate 284 may include a multilayer structure of two or more material layers, for example. In some embodiments, gate dielectric layer 282 and/or gate 284 may include grading (e.g., increasing and/or decreasing) the content/concentration of one or more materials in at least a portion of the feature(s). Additional layers may be present in the final gate stack, in some embodiments, such as one or more work function layers or other suitable layers, for example. Note that although gate dielectric layer 282 is only shown below gate 284 in the example embodiment of FIG. 2G, in other embodiments, the gate dielectric layer 282 may also be present on one or both sides of gate 284, such that the gate dielectric layer 282 is between gate 284 and spacers 250, for example.

Figure 2H:
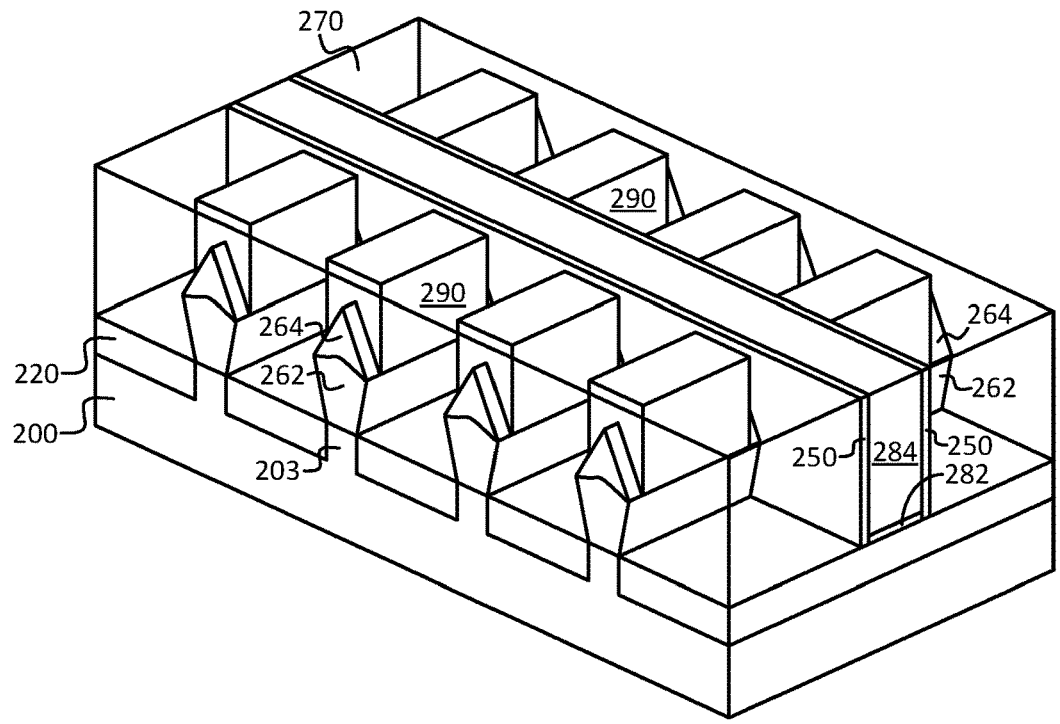
Figure 2H:
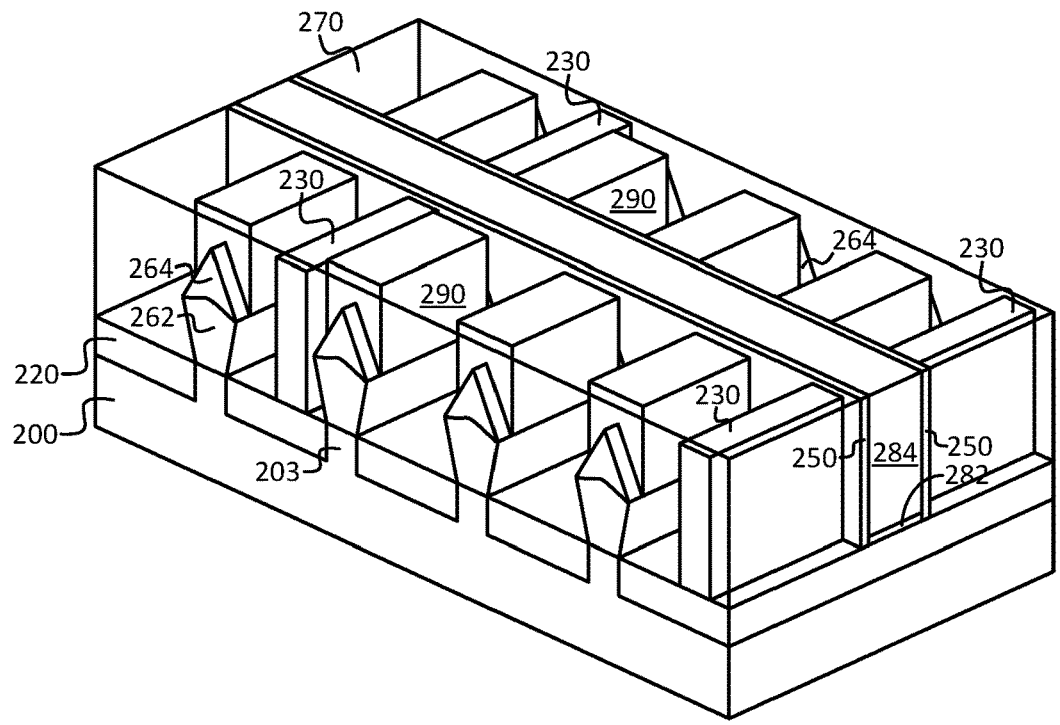

Method 100 of FIG. 1 continues with performing 118 S/D contact processing to form the example resulting structure of FIG. 2H, in accordance with an embodiment. As shown in FIG. 2H, S/D contacts 290 were formed to make contact to each of the S/D regions, in this example embodiment. As is also shown in FIG. 2H, the S/D contacts 290 are physically in contact with S/D cap portions 264, in this example embodiment, as those portions 264 include double-charge dopants as variously described herein (e.g., including S, Se, and/or Te dopants), thereby allowing for improved contact resistance at the 264/290 interface. In other embodiments, S/D contacts 290 may be in physical contact with some other portion of the S/D regions, as can be understood based on this disclosure. For instance, in embodiments where distinct S/D cap portions 264 are not present, such as where there is only one S/D portion per each S/D region (and such single S/D portions may include double-charge dopants near the top of each single S/D portion), the S/D contacts 290 may be in physical contact with each single S/D portion, to provide an example. In some embodiments, S/D contacts 290 may be formed using any suitable techniques, such as forming contact trenches in ILD layer 270 over the respective S/D regions and depositing metal or metal alloy (or other suitable electrically conductive material) in the trenches. In some embodiments, S/D contact 290 formation may include silicidation, germinidation, and/or annealing processes, for example. In some embodiments, S/D contacts 290 may include aluminum or tungsten, although any suitable conductive metal or alloy can be used, such as silver, nickel-platinum, or nickel-aluminum, for example. In some embodiments, one or more of the S/D contacts 290 may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact 290 regions, such as adhesion layers (e.g., titanium nitride) and/or liner or barrier layers (e.g., tantalum nitride), if so desired.

FIG. 2H' illustrates the example structure of FIG. 2H, including vertical isolation structures 230 of FIG. 2D', in accordance with an embodiment. Recall that process 110 is optional, such that the vertical isolation structures 230 need not be included in the IC structure. However, in the example structure of FIG. 2H', two such structures 230 are present. Such vertical isolation structures 230 may be etch resistant to the etch processes used during the IC fabrication (e.g., by the inclusion of an etch-resistant material, such as carbon), and thus they may further isolate single fins or groups of fins. For instance, as shown in FIG. 2H', the vertical isolation structures 230 are isolating the three right-most S/D regions from external portions of the IC structure (such as the left-most S/D regions). Such a configuration may be desired where, for example, those three right-most S/D regions are all of the same polarity (e.g., all n-type or all p-type), thereby allowing those same polarity S/D regions to be isolated from other polarity S/D regions (such as if the left-most S/D regions were the other polarity of n-type and p-type). The vertical isolation structures 230 may also allow for the material of adjacent S/D regions and/or S/D contacts to merge together, thereby providing barriers where desired to prevent said S/D region and/or S/D contact material from merging or contacting undesired material (such as S/D regions or contacts of another polarity). Numerous purposes and benefits of the vertical isolation structures 230 will be apparent in light of this disclosure and such vertical isolation structures 230 (where present) may be formed and included in the IC structure where desired.

Method 100 of FIG. 1 continues with completing 120 integrated circuit (IC) processing, as desired, in accordance with some embodiments. Such additional processing to complete the IC may include back-end or back-end-of-line (BEOL) processing to form one or more metallization layers and/or to interconnect the transistor devices formed, for example. Any other suitable processing may be performed, as will be apparent in light of this disclosure. Note that the processes 102-120 of method 100 are shown in a particular order in FIG. 1 for ease of description. However, one or more of the processes 102-120 may be performed in a different order or may not be performed at all. For example, box 110 is an optional process that need not be performed if the etch resistant vertical structures are not desired. Further, box 112 is an optional process that need not be performed in embodiments employing a gate first process flow, for example. Moreover, such a gate first process flow changes when process 116 is performed, as shown using alternative and optional gate first flow 100', whereby the final gate stack processing is performed 116 prior to performing 114 the S/D processing. Numerous variations on method 100 and the techniques described herein will be apparent in light of this disclosure. Recall that the techniques may be used to form one or more transistor devices including any of the following: field-effect transistors (FETs), metal-oxide-semiconductor FETs (MOSFETs), tunnel-FETs (TFETs), planar configurations, finned configurations (e.g., fin-FET, tri-gate, dual-gate), and/or nanowire (or nanoribbon or gate-all-around) configurations (having any number of nanowires). In addition, the devices formed may include p-type transistor devices (e.g., p-MOS or p-TFET) and/or n-type transistor devices (e.g., n-MOS or n-TFET). Further, the devices may include complementary MOS (CMOS) or complementary TFET (CTFET) or quantum devices (few to single electron). Numerous variations and configurations will be apparent in light of the present disclosure.

Example System

Figure 3:
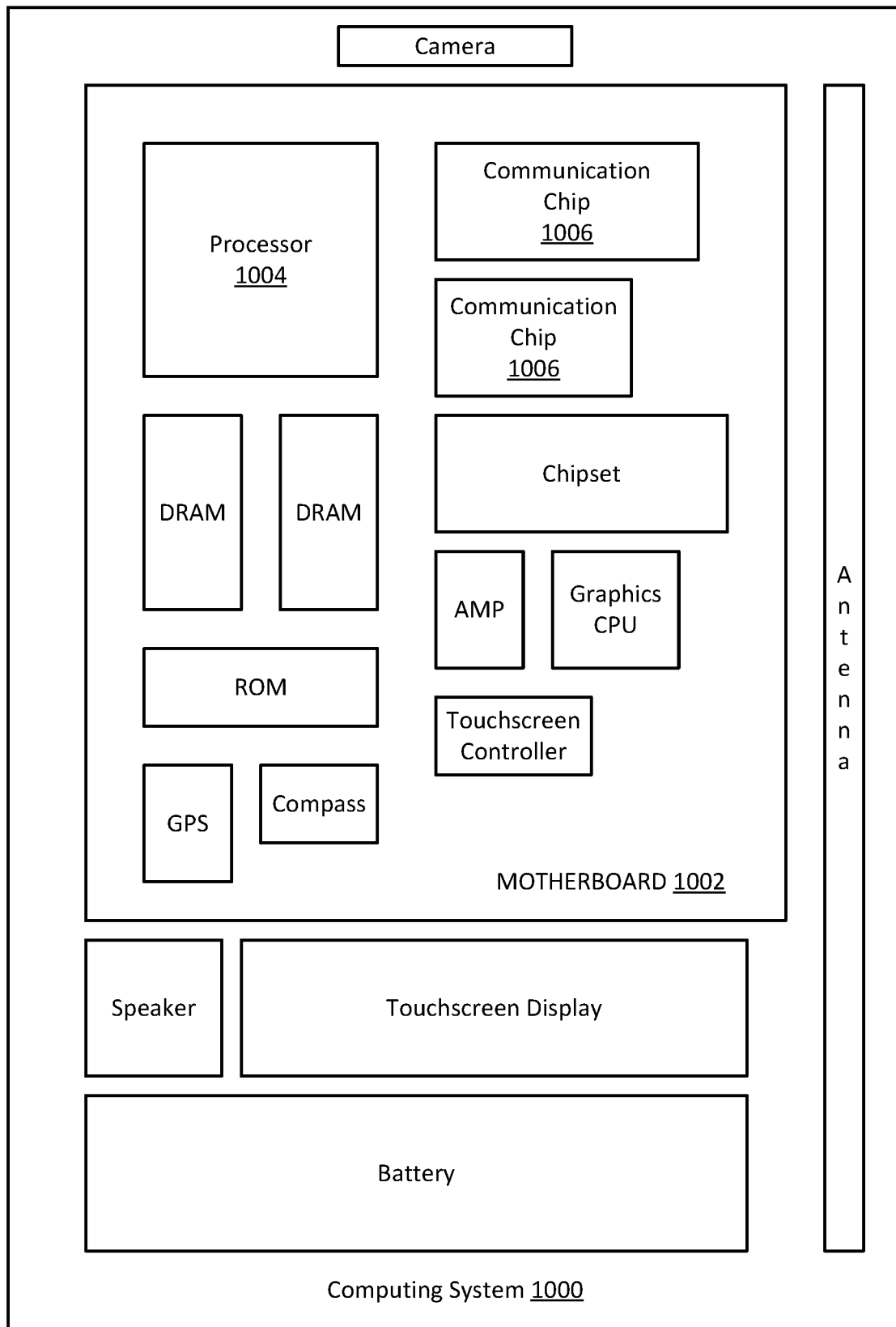
FIG. 3 illustrates a computing system implemented with integrated circuit structures and/or transistor devices formed using the techniques disclosed herein, in accordance with some embodiments of the present disclosure.

FIG. 3 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including: a substrate; and a transistor at least one of above and in the substrate. The transistor includes: a gate; a channel region below the gate; source and drain (S/D) regions adjacent the channel region, the S/D regions including group IV semiconductor material, wherein at least one of the S/D regions includes at least one of sulfur (S), selenium (Se), and tellurium (Te); and S/D contacts electrically connected to each of the S/D regions.

Example 2 includes the subject matter of Example 1, wherein the substrate includes group IV semiconductor material.

Example 3 includes the subject matter of any of Examples 1-2, further including a gate dielectric layer between the gate and the channel region.

Example 4 includes the subject matter of any of Examples 1-3, wherein the channel region includes at least one of silicon (Si), germanium (Ge), silicon germanium (SiGe), silicon germanium alloyed with carbon (SiGe:C), and germanium tin (GeSn).

Example 5 includes the subject matter of any of Examples 1-4, wherein the at least one S/D region includes only one of S, Se, and Te.

Example 6 includes the subject matter of any of Examples 1-5, wherein the at least one S/D region includes at least one of S, Se, and Te as dopants in a total concentration of at least 1E19 atoms per cubic centimeter.

Example 7 includes the subject matter of any of Examples 1-6, wherein the at least one S/D region includes at least one of S, Se, and Te as dopants in a total concentration in the range of 5E19 to 5E21 atoms per cubic centimeter.

Example 8 includes the subject matter of any of Examples 1-7, wherein the at least one S/D region further includes at least one of phosphorous (P), arsenic (As), and boron (B).

Example 9 includes the subject matter of any of Examples 1-8, wherein the at least one S/D region includes a main portion and a cap portion, the cap portion between the main portion and the respective S/D contact, and wherein the at least one of S, Se, and Te is included in only the cap portion.

Example 10 includes the subject matter of Example 9, wherein the main portion includes at least one of phosphorous (P), arsenic (As), and boron (B).

Example 11 includes the subject matter of any of Examples 1-10, wherein at least a portion of the at least one S/D region is n-type doped.

Example 12 includes the subject matter of any of Examples 1-10, wherein at least a portion of the at least one S/D region is p-type doped.

Example 13 includes the subject matter of any of Examples 1-12, wherein at least a portion of the at least one S/D region is degenerately doped.

Example 14 includes the subject matter of any of Examples 1-13, wherein the channel region has at least one of a finned, tri-gate, and finned field-effect transistor (FinFET) configuration.

Example 15 includes the subject matter of any of Examples 1-13, wherein the channel region has at least one of a nanowire, nanoribbon, and gate-all-around (GAA) configuration.

Example 16 includes the subject matter of any of Examples 1-15, wherein the transistor is one of a metal-oxide-semiconductor field-effect transistor (MOSFET) and a tunnel field-effect transistor (TFET).

Example 17 is a computing system including the subject matter of any of Examples 1-16.

Example 18 is an integrated circuit (IC) including: a substrate; a transistor at least one of above and in the substrate. The transistor includes: a gate stack including a gate dielectric layer and a gate; a channel region below the gate, wherein the gate dielectric is between the channel region and the gate; and source and drain (S/D) regions adjacent the channel region, the S/D regions including group IV semiconductor material, wherein at least one of the S/D regions includes double-charge dopants; and S/D contacts electrically connected to each of the S/D regions.

Example 19 includes the subject matter of Example 18, wherein the substrate includes group IV semiconductor material.

Example 20 includes the subject matter of any of Examples 18-19, wherein the channel region includes at least one of silicon (Si), germanium (Ge), silicon germanium (SiGe), silicon germanium alloyed with carbon (SiGe:C), and germanium tin (GeSn).

Example 21 includes the subject matter of any of Examples 18-20, wherein the double-charge dopants include at least one of sulfur (S), selenium (Se), and tellurium (Te).

Example 22 includes the subject matter of Example 21, wherein the at least one S/D region includes only one of S, Se, and Te.

Example 23 includes the subject matter of any of Examples 18-22, wherein the at least one S/D region includes the double-charge dopants in a total concentration of at least 1E20 atoms per cubic centimeter.

Example 24 includes the subject matter of any of Examples 18-23, wherein the at least one S/D region includes the double-charge dopants in a total concentration in the range of 5E19 to 5E21 atoms per cubic centimeter.

Example 25 includes the subject matter of any of Examples 18-24, wherein the at least one S/D region further includes single-charge dopants.

Example 26 includes the subject matter of any of Examples 18-25, wherein the at least one S/D region includes a main portion and a cap portion, the cap portion between the main portion and the respective S/D contact, and wherein the double-charge dopants are included in only the cap portion.

Example 27 includes the subject matter of Example 26, wherein the main portion includes at least one of phosphorous (P), arsenic (As), and boron (B).

Example 28 includes the subject matter of any of Examples 18-27, wherein at least a portion of the at least one S/D region is n-type doped.

Example 29 includes the subject matter of any of Examples 18-27, wherein at least a portion of the at least one S/D region is p-type doped.

Example 30 includes the subject matter of any of Examples 18-29, wherein at least a portion of the at least one S/D region is degenerately doped.

Example 31 includes the subject matter of any of Examples 18-30, wherein the channel region has at least one of a finned, tri-gate, and finned field-effect transistor (FinFET) configuration.

Example 32 includes the subject matter of any of Examples 18-30, wherein the channel region has at least one of a nanowire, nanoribbon, and gate-all-around (GAA) configuration.

Example 33 includes the subject matter of any of Examples 18-32, wherein the transistor is one of a metal-oxide-semiconductor field-effect transistor (MOSFET) and a tunnel field-effect transistor (TFET).

Example 34 is a computing system including the subject matter of any of Examples 18-33.

Example 35 is a method of forming an integrated circuit (IC), the method including: performing source and drain (S/D) processing to form S/D regions of a transistor, the S/D processing including incorporating double-charge dopants into at least one of the S/D regions, wherein the S/D regions include group IV semiconductor material and wherein the double-charge dopants include at least one of sulfur (S), selenium (Se), and tellurium (Te); and forming an S/D contact above each of the S/D regions.

Example 36 includes the subject matter of Example 35, wherein the double-charge dopants are incorporated into the at least one S/D region via ion implantation.

Example 37 includes the subject matter of Example 35, wherein the double-charge dopants are incorporated into the at least one S/D region during the formation of the group IV semiconductor material of that at least one S/D region.

Example 38 includes the subject matter of any of Examples 35-37, wherein the at least one S/D region includes a main portion and a cap portion, the cap portion between the main portion and the corresponding S/D contact, and wherein the double-charge dopants are only present in the cap portion.

Example 39 includes the subject matter of Example 38, wherein the main portion includes single-charge dopants.

Example 40 includes the subject matter of Example 39, wherein the single-charge dopants include at least one of phosphorous (P), arsenic (As), and boron (B).

Example 41 includes the subject matter of any of Examples 35-40, wherein the S/D processing includes removing material in the S/D regions and replacing the removed material with group IV semiconductor material.

Example 42 includes the subject matter of Example 35, further including: patterning hardmask on a substrate; performing shallow trench recess etch to form at least one fin; depositing a shallow trench isolation (STI) layer on two sides of a given fin; forming a dummy gate stack on the given fin and between the S/D regions, wherein a channel region is located at least below the dummy gate stack; and removing the dummy gate stack to form a final gate stack, the final gate stack including a gate and a gate dielectric layer between the gate and the channel region.

Example 43 includes the subject matter of Example 42, further including forming the channel region into one or more nanowires or nanoribbons after the dummy gate stack has been removed and prior to forming the final gate stack.

Example 44 includes the subject matter of any of Examples 42-43, further including forming a vertical isolation structure on at least one side of the given fin, wherein the vertical isolation structure is formed on the STI layer.

Example 45 includes the subject matter of any of Examples 42-44, wherein the given fin is native to the substrate.

Example 46 includes the subject matter of any of Examples 42-44, wherein the given fin is not native to the substrate.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:
1. An integrated circuit (IC) comprising:
  a transistor including
    a gate structure;
  a semiconductor region below the gate structure, the semiconductor region including a first group IV semiconductor material;
    a p-type source region and an n-type drain region adjacent to the semiconductor region, the p-type source and n-type drain regions including a second group IV semiconductor material that is different from the first group IV semiconductor material, wherein at least one of the p-t pe source or n-type drain regions includes two or more of sulfur (S), selenium (Se), or tellurium (Te) combined with a single-charge dopant species selected from the group consisting of P, As and B, and the other of the p-type source or n-type drain regions does not include double-charge dopants; and
a source contact structure and a drain contact structure connected to the p-type source region and the n-type drain region, respectively.

2. The IC of claim 1, further comprising a substrate, wherein the substrate includes a third group IV semiconductor material and the transistor is at least one of above and in the substrate.

3. The IC of claim 1, wherein the gate structure includes a gate dielectric layer and a gate electrode, the gate dielectric layer between the gate electrode and the semiconductor region, and wherein each of the source and drain contact structures includes a suicide or a germanide.

4. The IC of claim 1, wherein the semiconductor region includes at least one of silicon (Si), germanium (Ge), silicon germanium (SiGe), silicon and germanium alloyed with carbon (SiGe:C), or germanium tin (GeSn).

5. The IC of claim 1, wherein the two or more of S, Se, or Te are included in an entirety of the one of the p-type source or n-type drain regions.

6. The IC of claim 1, wherein the one of the p-type source or n-type drain regions includes the two or more of S, Se, or Te in a total concentration in the range of 5E19 to 5E21 atoms per cubic centimeter.

7. The IC of claim 1, wherein the one of the p-type source or n-type drain regions further includes one or both of silicon and germanium.

8. The IC of claim 1, wherein the one of the p-type source or n-type drain regions includes a main portion and a cap portion, the cap portion between the main portion and the respective source or drain contact structure, and wherein the two or more of S, Se, or Te are included in only the cap portion.

9. The IC of claim 1, wherein at least a portion of the one of the p-type source or n-type drain regions is degenerately doped.

10. The IC of claim 1, wherein the semiconductor region is part of a fin structure, and the gate structure is on top and side wails of the fin structure.

11. The IC of claim 1, wherein the semiconductor region has at least one of a nanowire or nanoribbon configuration, and the gate structure wraps around the semiconductor region.

12. The IC of claim 1, wherein the two or more of sulfur (S), selenium (Se), or tellurium (Te) have a higher concentration at a top of the one of the p-type source or n-type drain regions than at a bottom of the one of the p-type source or n-type drain regions, and wherein the at least one of the p-type source or n-type drain regions further comprises the single-charge dopant species having a higher concentration at the bottom of the one of the p-type source or n-type drain regions than at the top of the one of the p-type source or n-type drain regions.

13. An integrated circuit (IC) comprising:
a transistor including
a gate stack including a gate dielectric and a gate electrode;
a semiconductor region below the gate stack, the semiconductor region including a first group IV semiconductor material, wherein the gate dielectric includes a high-k dielectric material and is between the semiconductor region and the gate electrode;
a p-type source region and an n-type drain region adjacent to the semiconductor region, the p-type source and n-type drain regions including a second group IV semiconductor material that is different from the first group IV semiconductor material, wherein one of the p-type source or n-type drain regions includes two or more species of double-charge dopants combined with a single-charge dopant species selected from the group consisting of P. As and B, wherein the two or more species of double-charge dopants includes at least two of sulfur (S), selenium (Se), or tellurium (Te), and the other of the p-type source or n-type drain regions does not include double-charge dopants: and
a source contact structure and a drain contact structure connected to the p-type source region and the n-type drain region, respectively.

14. The IC of claim 13, wherein the one of the p-type source or n-type drain regions includes the two or more species of double-charge dopants in a concentration of at least 1E20 atoms per cubic centimeter.

15. An integrated circuit (IC) comprising:
a semiconductor region including a first group IV semiconductor material;
a gate structure including a gate dielectric and a gate electrode, the gate structure at least on top and side surfaces of the semiconductor region, such that at least a part of the semiconductor region is between portions of the gate structure;
a p-type source structure and an n-type drain structure adjacent to the semiconductor region, the p-type source and n-type drain structures each including a. second group IV semiconductor material that is different from the first group IV semiconductor material, wherein one of the p-type source and n-type drain regions further includes two or more species of double-charge dopants combined with a single-charge dopant species selected from the group consisting of P, As and B, wherein the two or more species of double-charge dopants includes at least two of sulfur (S), selenium (Se), or tellurium (Te), and the other of the p-type source structure or n-type drain structure does not include double-charge dopants; and
a source contact structure and a drain contact structure connected to the p-type source structure and the n-type drain structure, respectively, each of the source and drain contact structures including a silicide or a germanide.

16. The IC of claim 15, wherein the two or more species of double-charge dopants are present throughout an entirety of one of the p-type source and n-type drain structures.

* * * * *